US012733404B2

(12) United States Patent
Iwasaki et al.

(10) Patent No.: US 12,733,404 B2
(45) Date of Patent: Sep. 8, 2026

(54) STORAGE DEVICE

(71) Applicant: Kioxia Corporation, Tokyo (JP)

(72) Inventors: Takeshi Iwasaki, Kuwana Mie (JP); Zhu Qi, Yokkaichi Mie (JP); Katsuyoshi Komatsu, Yokkaichi Mie (JP); Jieqiong Zhang, Chiyoda Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 391 days.

(21) Appl. No.: 18/454,960

(22) Filed: Aug. 24, 2023

(65) Prior Publication Data

US 2024/0099153 A1 Mar. 21, 2024

(30) Foreign Application Priority Data

Sep. 21, 2022 (JP) ................................ 2022-150281

(51) Int. Cl.

*H10N 50/10* (2023.01)
*G11C 5/08* (2006.01)
*H10B 61/00* (2023.01)
*H10N 50/85* (2023.01)

(52) U.S. Cl.

CPC ............... *H10N 50/10* (2023.02); *G11C 5/08* (2013.01); *H10B 61/10* (2023.02); *H10N 50/85* (2023.02)

(58) Field of Classification Search

CPC .......... H10N 50/10; H10N 50/85; G11C 5/08; G11C 11/161; H10B 61/10

See application file for complete search history.

(56) References Cited

U.S. PATENT DOCUMENTS

| | | | |
|---|---|---|---|
| 8,395,928 B2 | 3/2013 | Brewer et al. | |
| 9,029,187 B1 | 5/2015 | Ananthan et al. | |
| 2016/0336378 A1 | 11/2016 | Ohba et al. | |
| 2018/0204881 A1 * | 7/2018 | Sei | H10B 63/84 |
| 2020/0286954 A1 | 9/2020 | Usami et al. | |

FOREIGN PATENT DOCUMENTS

| | | |
|---|---|---|
| TW | 201535373 A | 9/2015 |
| TW | 202034458 A | 9/2020 |
| TW | 202230787 A | 8/2022 |

* cited by examiner

*Primary Examiner* — Ermias T Woldegeorgis
(74) *Attorney, Agent, or Firm* — Foley & Lardner LLP

(57) ABSTRACT

A storage device includes a first conductive layer, a second conductive layer, a third conductive layer, a variable resistance layer disposed between the first conductive layer and the second conductive layer, and a switching layer disposed between the second conductive layer and the third conductive layer. The second conductive layer is disposed between the first conductive layer and the third conductive layer. The switching layer includes a first area, a second area, and a third area disposed between the first area and the second area. The first area includes a first element selected from Sn, Ga, Zn, Ta, Ti, and In, and O or N. The second area includes a second element selected from Sn, Ga, Zn, Ta, Ti, and In, and O or N. The third area includes a third element selected from Zr, Y, Ce, Hf, Al, Mg, and Nb, O or N, and a metal element selected from Te, Sb, Bi, Ti, and Zn.

19 Claims, 8 Drawing Sheets

FIG. 3

V=Vwrite

STORAGE DEVICE

CROSS-REFERENCE TO RELATED APPLICATION(S)

This application is based upon and claims the benefit of priority from Japanese Patent Application No. 2022-150281, filed Sep. 21, 2022, the entire contents of which are incorporated herein by reference.

FIELD

Embodiments described herein relate generally to a storage device.

BACKGROUND

As a large-capacity nonvolatile storage device, there is a cross-point type two-terminal storage device. The cross-point type two-terminal storage device facilitates miniaturization and high integration of memory cells.

A memory cell of the cross-point type two-terminal storage device includes, for example, a resistance-variable element and a switching element. The memory cell includes a switching element, and thus a current flowing to a memory cell other than a selected memory cell is reduced.

The switching element is required to have excellent characteristics such as a low leakage current, a high on-current, and high reliability.

DESCRIPTION OF THE DRAWINGS

FIG. 3 is an explanatory diagram illustrating a problem of the storage device according to the first embodiment.

DETAILED DESCRIPTION

Figure 1:
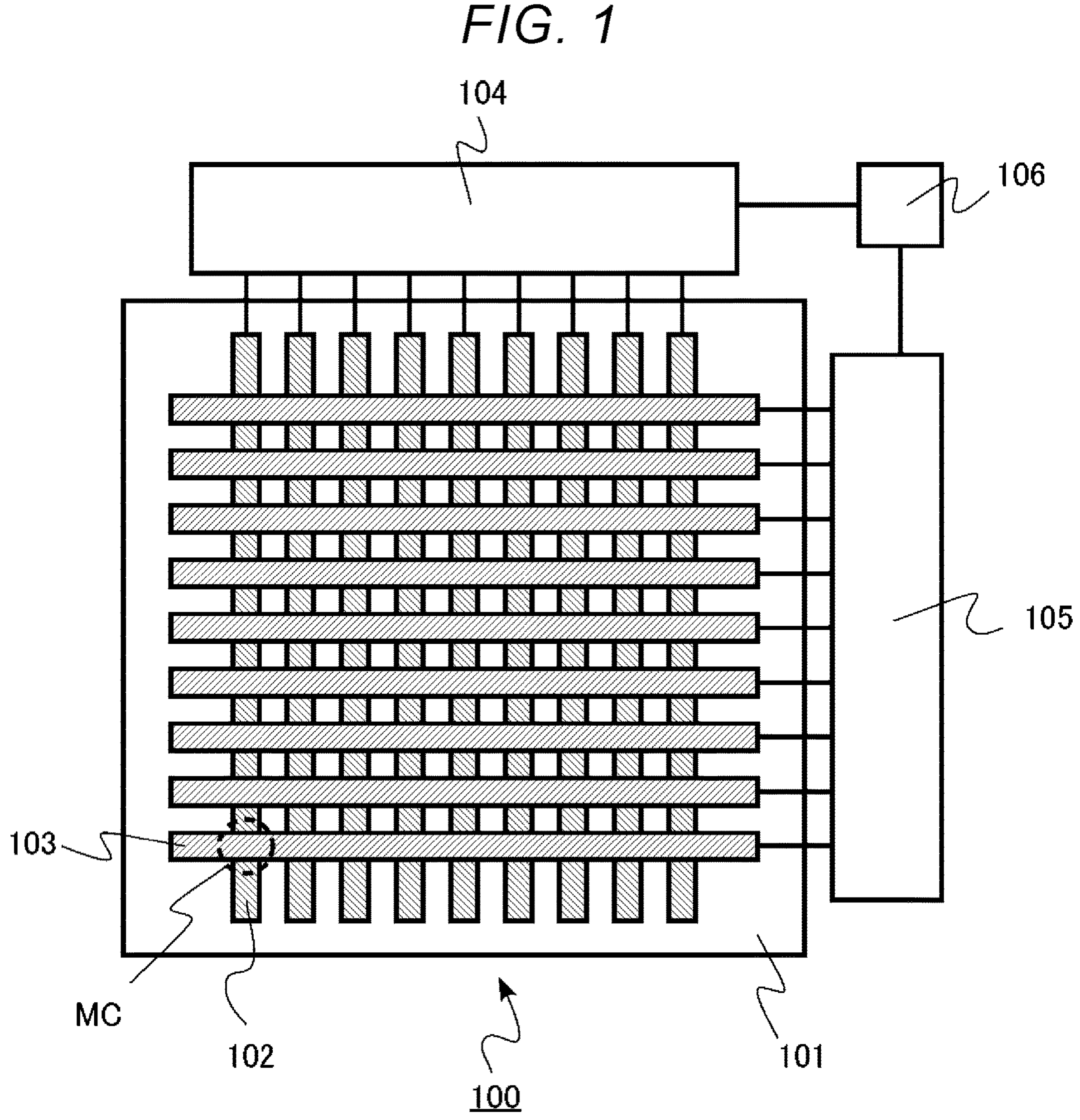
FIG. 1 is a block diagram illustrating a storage device according to a first embodiment.

Embodiments provide a storage device including switching elements with excellent characteristics.

In general, according to at least one embodiment, a storage device includes a first conductive layer, a second conductive layer, a third conductive layer, a variable resistance layer disposed between the first conductive layer and the second conductive layer, and a switching layer disposed between the second conductive layer and the third conductive layer, the second conductive layer is disposed between the first conductive layer and the third conductive layer, the switching layer includes a first area, a second area, and a third area disposed between the first area and the second area, the first area includes at least one first element selected from the group consisting of tin (Sn), gallium (Ga), zinc (Zn), tantalum (Ta), titanium (Ti), and indium (In), and oxygen (O) or nitrogen (N), the second area includes at least one second element selected from the group consisting of tin (Sn), gallium (Ga), zinc (Zn), tantalum (Ta), titanium (Ti), and indium (In), and oxygen (O) or nitrogen (N), and the third area includes at least one third element selected from the group consisting of zirconium (Zr), yttrium (Y), cerium (Ce), hafnium (Hf), aluminum (Al), magnesium (Mg), and niobium (Nb), oxygen (O) or nitrogen (N), and at least one metal element selected from the group consisting of tellurium (Te), antimony (Sb), bismuth (Bi), titanium (Ti), and zinc (Zn).

Embodiments of the present disclosure are described below with reference to the drawings. In the following description, the same or similar members are denoted by the same reference numerals, and descriptions of members that are once described are omitted as appropriate.

The qualitative analysis and quantitative analysis of chemical compositions of members constituting a storage device in the present specification may be performed, for example, by secondary ion mass spectroscopy (SIMS), energy dispersive X-ray spectroscopy (EDX), or electron energy loss spectroscopy (EELS). In addition, for example, a transmission electron microscope (TEM) may be used to measure thicknesses of members constituting the storage device, distances between the members, and the like. Further, for example, X-ray photoelectron spectroscopy (XPS) may be used to identify substances of the members constituting the storage device and to measure existence ratios of the substances.

First Embodiment

A storage device according to a first embodiment includes a first conductive layer, a second conductive layer, a third conductive layer, a variable resistance layer disposed between the first conductive layer and the second conductive layer, and a switching layer disposed between the second conductive layer and the third conductive layer. The second conductive layer is disposed between the first conductive layer and the third conductive layer. The switching layer includes a first area, a second area, a third area disposed between the first area and the second area, a first area includes at least one first element selected from the group consisting of tin (Sn), gallium (Ga), zinc (Zn), tantalum (Ta), titanium (Ti), and indium (In), and oxygen (O) or nitrogen (N), the second area includes at least one second element selected from the group consisting of tin (Sn), gallium (Ga), zinc (Zn), tantalum (Ta), titanium (Ti), and indium (In), and oxygen (O) or nitrogen (N), and the third area includes at least one third element selected from the group consisting of zirconium (Zr), yttrium (Y), cerium (Ce), hafnium (Hf), aluminum (Al), magnesium (Mg), and niobium (Nb), oxygen (O) or nitrogen (N), and at least one metal element selected from the group consisting of tellurium (Te), antimony (Sb), bismuth (Bi), titanium (Ti), and zinc (Zn).

In addition, the storage device according to the first embodiment includes a plurality of pieces of first wiring, a plurality of pieces of second wiring intersecting the plurality of pieces of first wiring, and memory cells positioned in areas where the first wiring and second wiring intersect each other. The memory cell includes a first conductive layer, a second conductive layer, a third conductive layer, a variable resistance layer disposed between the first conductive layer and the second conductive layer, and a switching layer disposed between the second conductive layer and the third conductive layer. The second conductive layer is disposed between the first conductive layer and the third conductive layer. The switching layer includes a first area, a second area, a third area disposed between the first area and the second area, the first area includes at least one first element selected from the group consisting of tin (Sn), gallium (Ga), zinc (Zn), tantalum (Ta), titanium (Ti), and indium (In), and oxygen (O) or nitrogen (N), the second area includes at least one second element selected from the group consisting of tin (Sn), gallium (Ga), zinc (Zn), tantalum (Ta), titanium (Ti), and indium (In), and oxygen (O) or nitrogen (N), and the third area includes at least one third element selected from the group consisting of zirconium (Zr), yttrium (Y), cerium (Ce), hafnium (Hf), aluminum (Al), magnesium (Mg), and niobium (Nb), oxygen (O) or nitrogen (N), and at least one metal element selected from the group consisting of tellurium (Te), antimony (Sb), bismuth (Bi), titanium (Ti), and zinc (Zn).

FIG. 1 is a block diagram illustrating the storage device according to the first embodiment.

A memory cell array 100 of the storage device according to the first embodiment includes, for example, a plurality of word lines 102 and a plurality of bit lines 103 intersecting the word lines 102 via an insulating layer on a semiconductor substrate 101. The bit lines 103 are provided, for example, on the upper layer of the word lines 102. As peripheral circuits, a first control circuit 104, a second control circuit 105, and a sense circuit 106 are provided around the memory cell array 100.

The word line 102 is an example of the first wiring. In addition, the bit line 103 is an example of the second wiring.

In the areas where the word lines 102 and the bit lines 103 intersect each other, a plurality of memory cells MC are provided. The storage device according to the first embodiment is a two-terminal magnetoresistive memory having a cross-point structure.

The plurality of word lines 102 each are connected to the first control circuit 104. In addition, the plurality of bit lines 103 each are connected to the second control circuit 105. The sense circuit 106 is connected to the first control circuit 104 and the second control circuit 105.

The first control circuit 104 and the second control circuit 105 have functions of selecting the desired memory cell MC, writing data onto the memory cell MC, reading data of the memory cell MC, erasing data of the memory cell MC, and the like. At the time of reading data, the data of the memory cell MC is read as a current amount flowing between the word line 102 and the bit line 103. The sense circuit 106 has a function of determining the current amount and determining a polarity of data. For example, the sense circuit 106 determines "0" or "1" of data.

The first control circuit 104, the second control circuit 105, and the sense circuit 106 are implemented by, for example, electronic circuits using the semiconductor devices formed on the semiconductor substrates 101.

Figure 2:
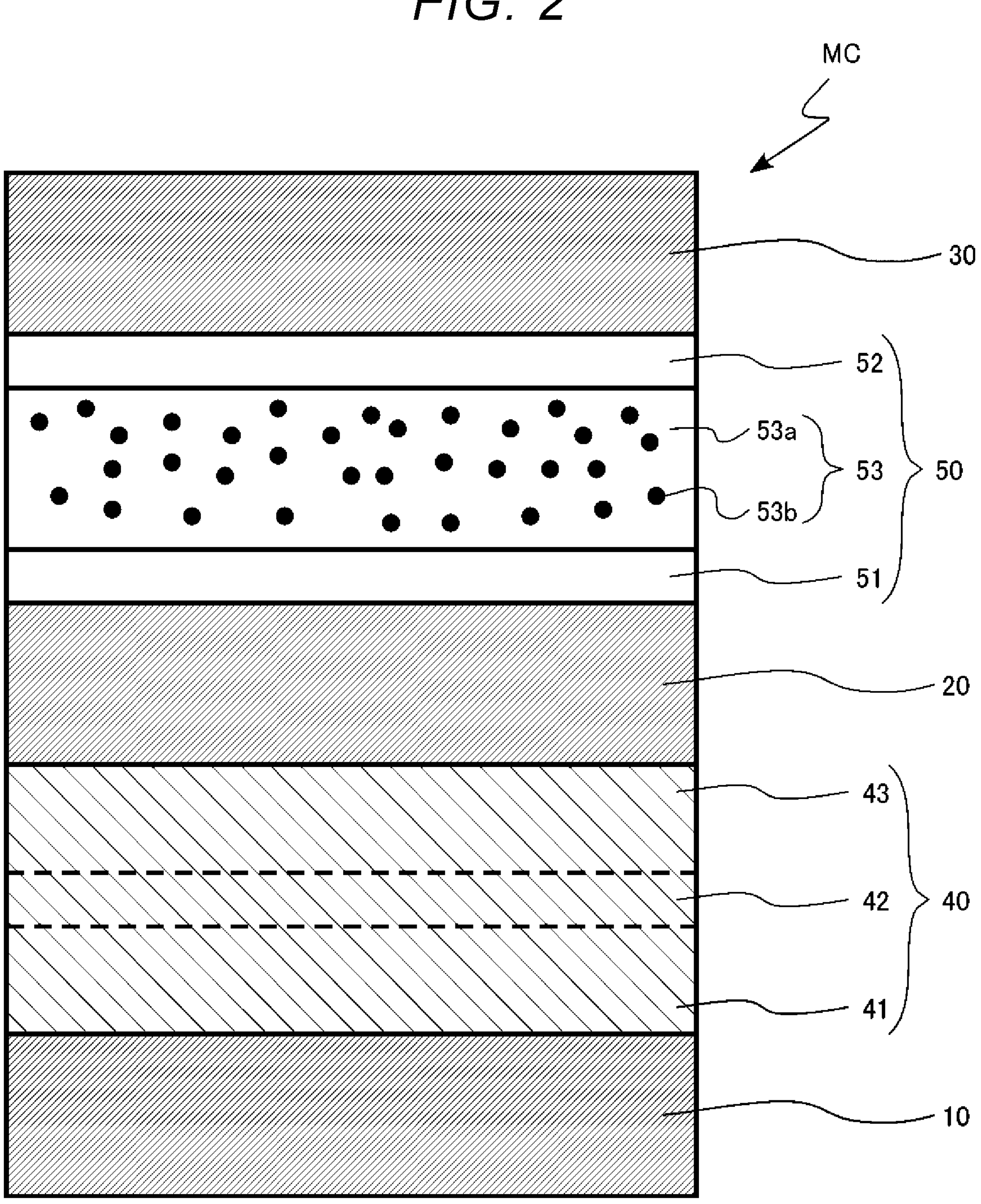
FIG. 2 is a schematic cross-sectional view illustrating a memory cell of the storage device according to the first embodiment.

FIG. 2 is a schematic cross-sectional view illustrating the memory cell of the storage device according to the first embodiment. FIG. 2 illustrates a cross section of one memory cell MC indicated by a dotted line circle in the memory cell array 100 of FIG. 1.

As illustrated in FIG. 2, the memory cell MC includes a lower electrode 10, an intermediate electrode 20, an upper electrode 30, a variable resistance layer 40, and a switching layer 50. The variable resistance layer 40 includes a fixed layer 41, a tunnel layer 42, and a free layer 43. The switching layer 50 includes a first area 51, a second area 52, and a third area 53. The third area 53 includes a matrix 53*a* and metal 53*b*.

The lower electrode 10 is an example of the first conductive layer. The intermediate electrode 20 is an example of the second conductive layer. The upper electrode 30 is an example of the third conductive layer.

The lower electrode 10, the variable resistance layer 40, and the intermediate electrode 20 constitute a resistance-variable element of the memory cell MC. The intermediate electrode 20, the switching layer 50, and the upper electrode 30 constitute a switching element of the memory cell MC.

The lower electrode 10 is connected to the word line 102. The lower electrode 10 is, for example, metal. The lower electrode 10 includes, for example, titanium (Ti), tungsten (W), tantalum (Ta), platinum (Pt), or nitrides thereof. The lower electrode 10 is, for example, titanium nitride. The lower electrode 10 may be a portion of the word line 102.

The upper electrode 30 is connected to the bit line 103. The upper electrode 30 is, for example, metal. The upper electrode 30 is, for example, titanium (Ti), tungsten (W), tantalum (Ta), platinum (Pt), or nitrides thereof. The upper electrode 30 is, for example, titanium nitride. The upper electrode 30 may be a portion of the bit line 103.

The intermediate electrode 20 is provided between the lower electrode 10 and the upper electrode 30. The intermediate electrode 20 is, for example, metal. The intermediate electrode 20 is, for example, titanium (Ti), tungsten (W), tantalum (Ta), platinum (Pt), or nitrides thereof. The intermediate electrode 20 is, for example, titanium nitride.

The variable resistance layer 40 is provided between the lower electrode 10 and the intermediate electrode 20. The variable resistance layer 40 includes the fixed layer 41, the tunnel layer 42, and the free layer 43. The variable resistance layer 40 includes a magnetic tunnel junction configured with the fixed layer 41, the tunnel layer 42, and the free layer 43.

The variable resistance layer 40 has a function of storing data by resistance change.

The fixed layer 41 is a ferromagnetic body. In the fixed layer 41, a magnetization direction is fixed in a specific direction.

The tunnel layer 42 is an insulator. Electrons pass through the tunnel layer 42 due to the tunnel effect.

The free layer 43 is a ferromagnetic body. In the free layer 43, the magnetization direction changes. The magnetization direction of the free layer 43 can be in any of a direction parallel to the magnetization direction of the fixed layer 41 and a direction opposite to the magnetization direction of the fixed layer 41. For example, when the current flows between the lower electrode 10 and the intermediate electrode 20, the magnetization direction of the free layer 43 can be changed.

When the magnetization direction of the free layer 43 is changed, the resistance of the variable resistance layer 40 is changed. When magnetization direction of the free layer 43 is antiparallel to the magnetization direction of the fixed layer 41, the variable resistance layer 40 is in a high resistance state in which the current hardly flows. Meanwhile, when the magnetization direction of the free layer 43 is a direction parallel to the magnetization direction of the fixed layer 41, the variable resistance layer 40 is in a low resistance state in which the current easily flows.

The switching layer 50 is provided between the intermediate electrode 20 and the upper electrode 30. The thickness of the switching layer 50 in the first direction from the lower electrode 10 to the upper electrode 30 is, for example, 2 nm or more and 10 nm or less.

The switching layer 50 has nonlinear current voltage characteristics in which the current sharply rises at a specific voltage (threshold voltage). The switching layer 50 has a function of reducing the increase of half-selected leakage currents flowing through half-selected cells.

The switching layer 50 includes the first area 51, the second area 52, and the third area 53. The third area 53 is provided between the first area 51 and the second area 52.

The first area 51 is provided between the intermediate electrode 20 and the third area 53. The first area 51 is in contact, for example, with the intermediate electrode 20 and the third area 53.

The first area 51 includes at least one first element selected from the group consisting of tin (Sn), gallium (Ga), zinc (Zn), tantalum (Ta), titanium (Ti), and indium (In), and oxygen (O) or nitrogen (N). The first area 51 includes at least any one of oxygen (O) and nitrogen (N).

Among elements other than oxygen (O) and nitrogen (N), for example, an element having a higher atomic concentration than the first element does not exist in the first area 51.

The first area 51 includes at least one first substance selected from the group consisting of oxides of the first element, nitrides of the first element, and oxynitrides of the first element. The first substance is, for example, a main component of the first area 51. The expression "the first substance is a main component of the first area 51" means that no substance having a higher mole fraction than the first substance exists in the first area 51. In addition, the mole fraction has the same meaning as a substance amount fraction.

The mole fraction of the first substance provided in the first area 51 is, for example, 90 mol % or more.

The first substance is an insulator. Examples of the first substance include tin oxide, gallium oxide, zinc oxide, tantalum oxide, titanium oxide, and indium oxide.

The thickness of the first area 51 in the first direction from the lower electrode 10 to the upper electrode 30 is, for example, 0.5 nm or more and 3 nm or less.

The second area 52 is provided between the upper electrode 30 and the third area 53. The second area 52 is in contact, for example, with the upper electrode 30 and the third area 53.

The second area 52 includes at least one second element selected from the group consisting of tin (Sn), gallium (Ga), zinc (Zn), tantalum (Ta), titanium (Ti), and indium (In), and oxygen (O) or nitrogen (N). The second area 52 includes at least any one of oxygen (O) and nitrogen (N).

For example, among elements other than oxygen (O) and nitrogen (N), no element having a higher atomic concentration than the second element exists in the second area 52. The second element is, for example, the same element as the first element.

The second area 52 includes at least one second substance selected from the group consisting of oxides of the second element, nitrides of the second element, and oxynitrides of the second element. The second substance is, for example, a main component of the second area 52. The expression "the second substance is a main component of the second area 52" means that no substance having a higher mole fraction than the second substance exists in the second area 52.

The mole fraction of the second substance provided in the second area 52 is, for example, 90 mol % or more.

The second substance is an insulator. Examples of the second substance include tin oxide, gallium oxide, zinc oxide, tantalum oxide, titanium oxide, and indium oxide. The second substance is, for example, the same substance as the first substance.

The thickness of the second area 52 in the first direction from the lower electrode 10 to the upper electrode 30 is, for example, 0.5 nm or more and 3 nm or less.

The third area 53 is provided between the first area 51 and the second area 52. For example, the third area 53 is in contact with the first area 51 and the second area 52.

The third area 53 includes a matrix 53*a* and a metal 53*b*.

The third area 53 includes at least one third element selected from the group consisting of zirconium (Zr), yttrium (Y), cerium (Ce), hafnium (Hf), aluminum (Al), magnesium (Mg), and niobium (Nb), oxygen (O) or nitrogen (N), and at least one metal element selected from the group consisting of tellurium (Te), antimony (Sb), bismuth (Bi), titanium (Ti), and zinc (Zn). The third area 53 includes at least any one of oxygen (O) and nitrogen (N). Hereinafter, at least one metal element selected from the group consisting of tellurium (Te), antimony (Sb), bismuth (Bi), titanium (Ti), and zinc (Zn) is referred to as an additive metal element.

For example, among elements other than oxygen (O) and nitrogen (N), no element having a higher atomic concentration than the third element or the additive metal element exists in the third area 53. The additive metal element is different, for example, from the first element. The additive metal element is different, for example, from the second element.

The third element and at least any one of oxygen (O) and nitrogen (N) are included, for example, in the matrix 53*a*. In addition, the additive metal element is, for example, provided in the metal 53*b*.

The third area 53 includes at least one third substance selected from the group consisting of oxides of the third element, nitrides of the third element, and oxynitride of the third element.

The third substance is an insulator. Examples of the third substance include zirconium oxide, yttrium oxide, cerium oxide, hafnium oxide, aluminum oxide, aluminum nitride, aluminum oxynitride, magnesium oxide, or niobium oxide.

The third substance is, for example, provided in the matrix 53*a*.

The third area 53 includes metal of an additive metal element. Hereinafter, the metal of the additive metal element is referred to as additive metal. Examples of the additive metal include tellurium, antimony, bismuth, titanium, and zinc. The additive metal is included, for example, in the metal 53*b* of the third area 53.

The third substance and the additive metal are main components of the third area 53. The expression "the third substance and the additive metal are main components of the third area 53" means that no substance having a higher mole fraction than the third substance and the additive metal exists in the third area 53.

The mole fraction of the third substance provided in the third area 53 is, for example, 50 mol % or more and 90 mol % or less. The mole fraction of the additive metal provided in the third area 53 is, for example, 10 mol % or more and 40 mol % or less. The mole fraction of the third substance provided in the third area 53 is higher, for example, than the mole fraction of the additive metal provided in the third area 53.

The atomic concentration of the additive metal element provided in the first area 51 is lower than the atomic concentration of the additive metal element provided in the third area 53. In addition, the atomic concentration of the additive metal element provided in the second area 52 is lower than the atomic concentration of the additive metal element provided in the third area 53.

The mole fraction of the additive metal provided in the first area 51 is lower than the mole fraction of the additive metal provided in the third area 53. The mole fraction of the additive metal provided in the first area 51 is, for example, 5 mol % or less.

In addition, the mole fraction of the additive metal provided in the second area 52 is lower than the mole fraction of the additive metal provided in the third area 53. The mole fraction of the additive metal provided in the second area 52 is, for example, 5 mol % or less.

The thickness of the third area 53 in the first direction from the lower electrode 10 to the upper electrode 30 is, for example, 1 nm or more and 5 nm or less.

The thickness of the third area 53 in the first direction from the lower electrode 10 to the upper electrode 30 is thicker, for example, than the thickness of the first area 51 in the first direction from the lower electrode 10 to the upper electrode 30. In addition, the thickness of the third area 53 in the first direction from the lower electrode 10 to the upper electrode 30 is thicker than the thickness of the second area 52 in the first direction from the lower electrode 10 to the upper electrode 30.

The electron affinity of the third area 53 is smaller than the electron affinity of the first area 51 and the electron affinity of the second area 52. In addition, the electron affinity of the third substance is smaller than the electron affinity of first substance and the electron affinity of the second substance.

The switching layer 50 may be formed, for example, by a sputtering method. The third area 53 including the matrix 53*a* and the metal 53*b* may be formed, for example, by a co-sputtering method using a target formed of the third substance and a target formed of additive metal.

Next, the actions and effects of the storage device according to the first embodiment is described.

As described above, in the storage device according to the first embodiment, the resistance of the variable resistance layer 40 is changed by changing the magnetization direction of the free layer 43. When the magnetization direction of the free layer 43 is a direction opposite to the magnetization direction of the fixed layer 41, the variable resistance layer 40 is in the high resistance state in which the current hardly flows. Meanwhile, when the magnetization direction of the free layer 43 is the direction parallel to the magnetization direction of the fixed layer 41, the variable resistance layer 40 is in the low resistance state in which the current easily flows.

For example, the high resistance state of the variable resistance layer 40 is defined as data of “1”, and the low resistance state is defined as data of “0”. By maintaining the different resistance states, the memory cell MC can store 1-bit data of “0” and “1”. The writing onto one memory cell is performed by flowing the current between the bit line and the word line connected to the cell.

Figure 3:
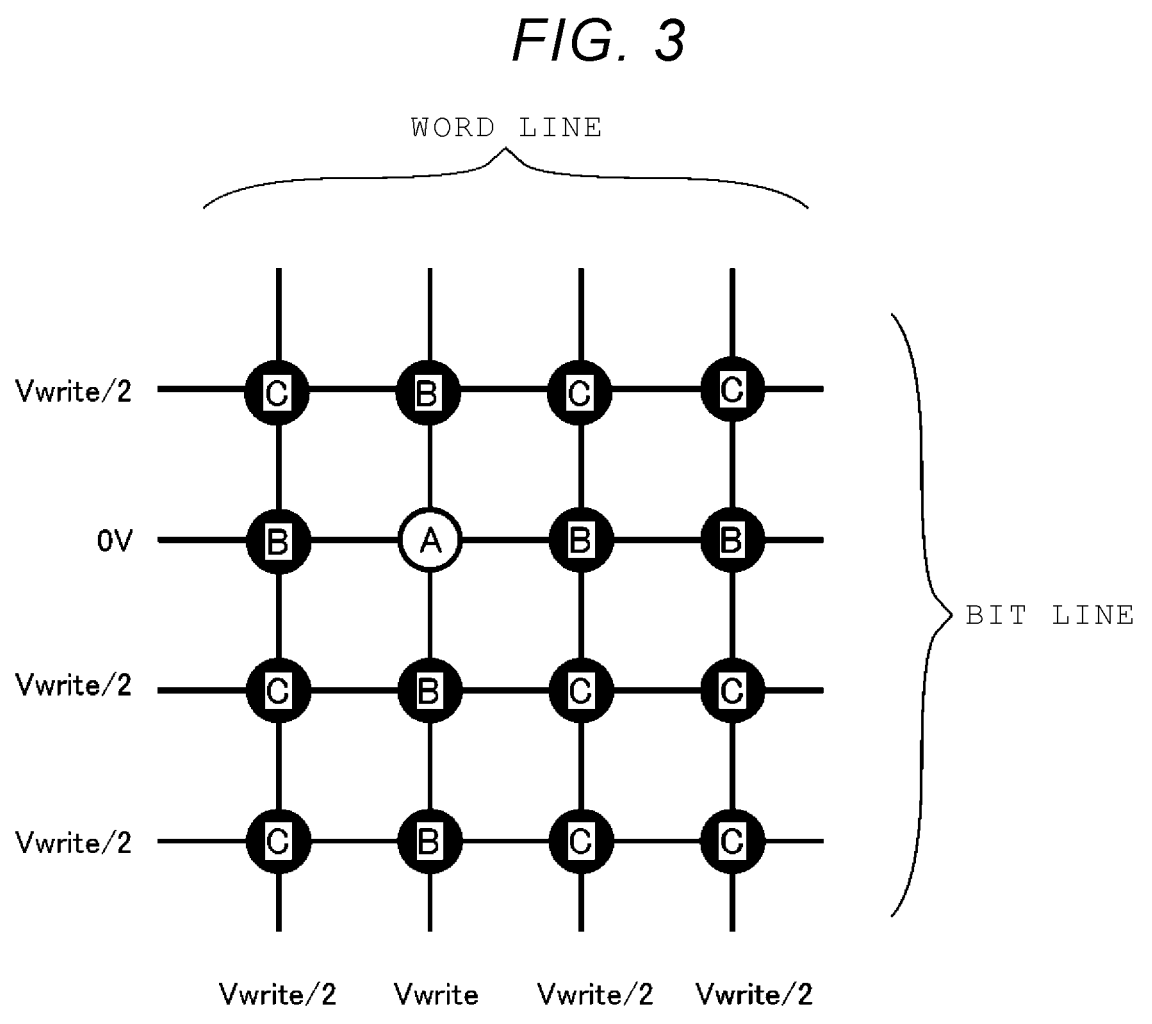

FIG. 3 is an explanatory diagram illustrating a problem of the storage device according to the first embodiment. FIG. 3 illustrates the voltage applied to the memory cell MC when selecting one memory cell MC in the memory cell array for a write operation. The intersection between the word line and the bit line indicates each of the memory cells MC.

The selected memory cell MC is a memory cell A (selected cell). A write voltage Vwrite is applied to a word line connected to the memory cell A. In addition, 0 V is applied to a bit line connected to the memory cell A.

Hereinafter, a case where a half voltage of the write voltage (Vwrite/2) is applied to the word line and the bit line that are not connected to the memory cell A is exemplified.

The voltage applied to a memory cell C (unselected cell) connected to the word line and the bit line that is not connected to the memory cell A is 0 V. That is, the voltage is not applied.

Meanwhile, a half voltage of the write voltage Vwrite (Vwrite/2) is applied to a memory cell B (half-selected cell) connected to the word line or the bit line connected to the memory cell A. Therefore, a half-selected leakage current flows through the memory cell B (half-selected cell).

Figure 4:
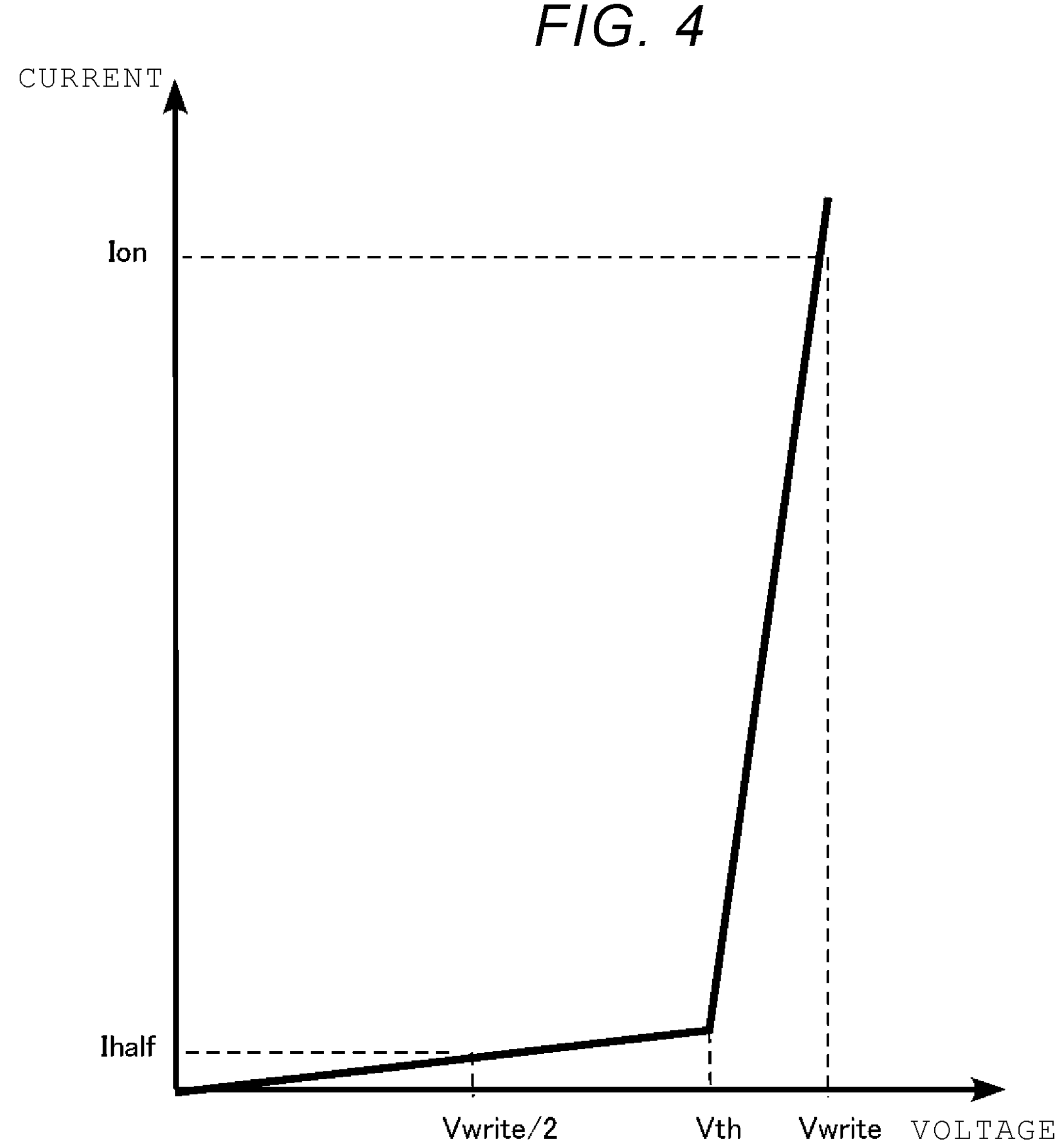
FIG. 4 is an explanatory diagram illustrating current voltage characteristics of the switching element according to the first embodiment.

FIG. 4 is an explanatory diagram illustrating current voltage characteristics of the switching element according to the first embodiment. The horizontal axis indicates the voltage applied to the switching element, and the vertical axis indicates the current flowing through the switching element.

The switching element has nonlinear current voltage characteristics in which the current sharply rises at a threshold voltage Vth. The threshold voltage Vth is, for example, 0.5 V or more and 3 V or less.

The write voltage Vwrite is set so that the write voltage Vwrite is higher than the threshold voltage Vth, and the half voltage of the write voltage Vwrite (Vwrite/2) is lower than the threshold voltage. The current flowing through the switching element when the write voltage Vwrite is applied is the on-current (Ion in FIG. 4). The current flowing through the switching element when the half voltage of the write voltage Vwrite (Vwrite/2) is applied is the half-selected leakage current (Ihalf of FIG. 4).

If the half-selected leakage current is large, for example, power consumption of a chip increases. In addition, for example, the voltage drop in the wiring increases, and a sufficiently high voltage is not applied to the selected cell, so that the write operation onto the memory cell MC becomes unstable. In addition, if the on-current is small, for example, the current flowing through the selected cell is insufficient, and thus the writing onto the memory cell MC becomes insufficient. Therefore, the current voltage characteristics of the switching element requires both of the low half-selected leakage current and the high on-current.

Figure 5A:
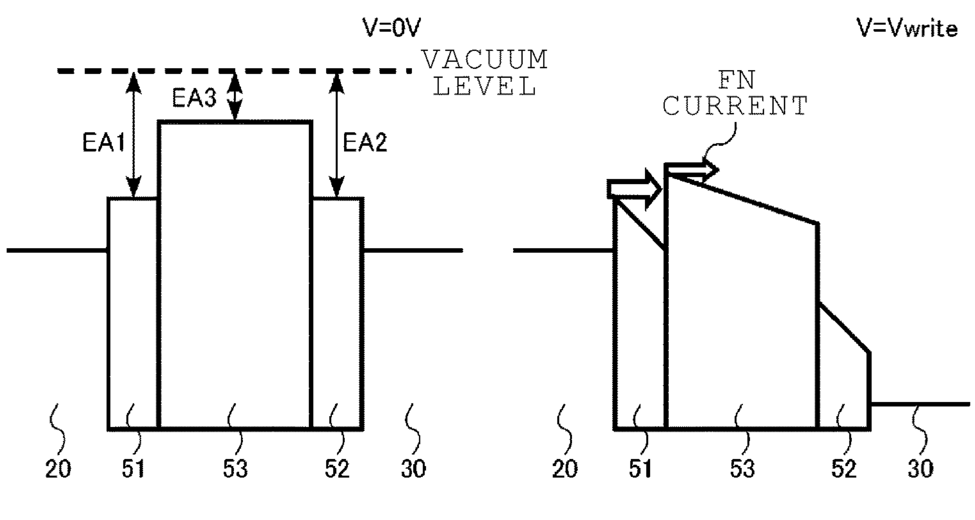
FIGS. 5A to 5C are explanatory diagrams illustrating actions and effects of the storage device according to the first embodiment.
Figure 5B:
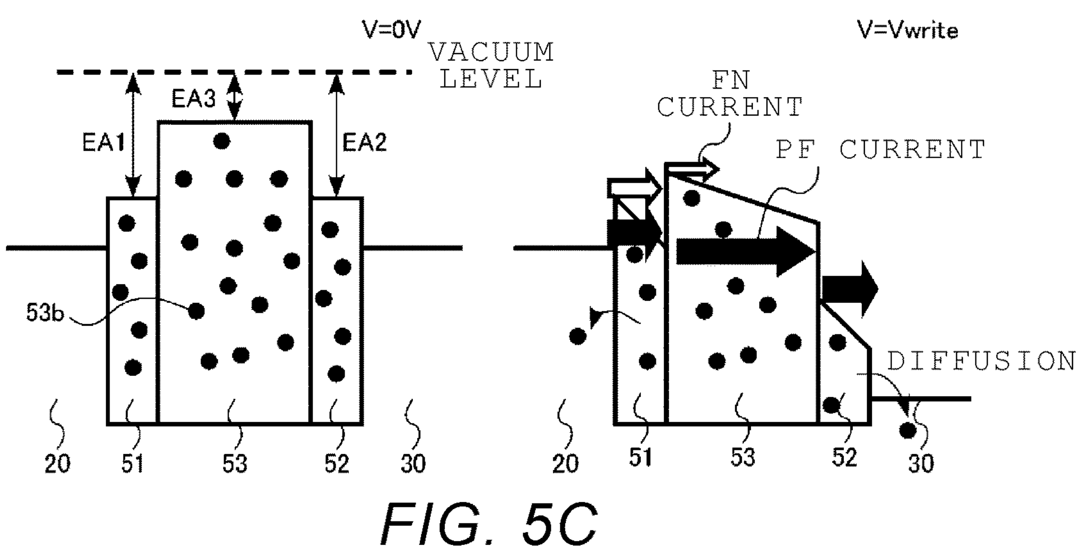
Figure 5C:
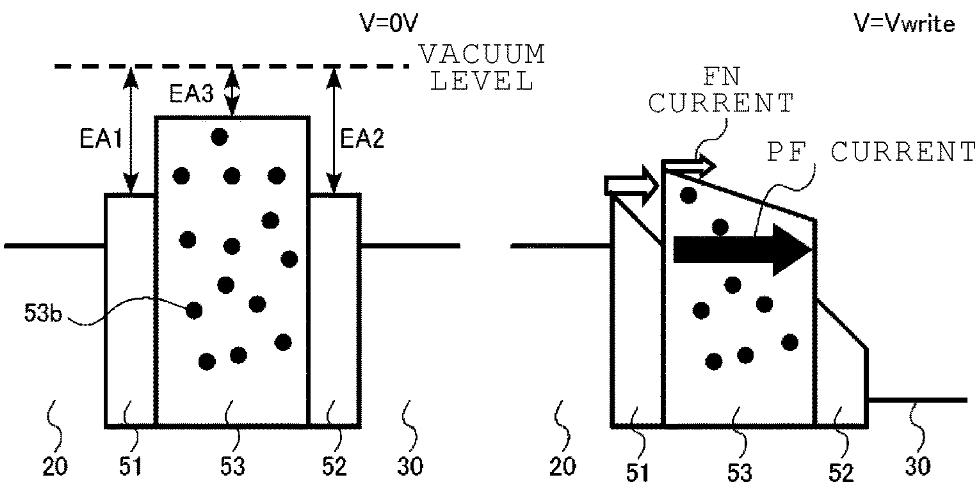

FIGS. 5A to 5C are explanatory diagrams illustrating actions and effects of the storage device according to the first embodiment. FIG. 5A is the explanatory diagram illustrating the current voltage characteristics of the switching element according to a first comparative example. FIG. 5B is the explanatory diagram illustrating the current voltage characteristics of the switching element according to a second comparative example. FIG. 5C is the explanatory diagram illustrating the current voltage characteristics of the switching element according to the first embodiment.

FIGS. 5A, 5B, and 5C illustrate band structures when a voltage is not applied to the switching element (left diagram) and when the write voltage Vwrite is applied to the switching element (right diagram).

The switching element according to the first comparative example is different from the switching element according to the first embodiment in that the third area 53 of the switching layer does not include the metal 53*b*.

As illustrated in the left diagram of FIG. 5A, the switching layer of the first comparative example is similar to the switching layer according to the first embodiment, and an electron affinity EA3 of the third area 53 is smaller than an electron affinity EA1 of the first area 51 and an electron affinity EA2 of the second area 52. In other words, the third area 53 has a three-layer structure interposed between the first area 51 and the second area 52 having a lower barrier to electrons than the third area 53. By providing the three-layer structure described above, for example, compared with the structure without the first area 51 and the second area 52, a low half-selected leakage current can be maintained, and the on-current can be increased.

As illustrated in the right diagram of FIG. 5A, when the write voltage Vwrite is applied to the upper electrode 30, an FN tunneling current (hereinafter referred to as an FN current) based on Fowler-Nordheim tunneling conduction (FN tunneling conduction) flows through the switching layer. By the application of the write voltage Vwrite, the FN current flows by the tunneling of electron through the first area 51, the third area 53, and the second area 52 in which the thicknesses of the barriers become thinner.

By being provided with the three-layer structure, the switching layer according to the first comparative example can increase the on-current while maintaining the low half-selected leakage current. However, for example, in order to improve the performance of the storage device, further increase of the on-current may be required.

Similarly to the switching layer according to the first embodiment, in the switching layer according to the second comparative example, the third area 53 of the switching layer includes the metal 53*b*. The switching layer according to the second comparative example is different from the switching layer according to the first embodiment in that, in addition to the third area 53, the first area 51 and the second area 52 also include the metal 53*b*.

As illustrated in the right diagram of FIG. 5B, when the write voltage Vwrite is applied to the upper electrode 30, a current based on Poole-Frenkel conduction (PF conduction) (hereinafter referred to as PF current) flows through the switching layer in addition to the FN current. The PF current flows by movement of the electrons by hopping between levels formed by the metal 53*b* provided in the first area 51, the third area 53, and the second area 52.

In the switching element according to the second comparative example, the on-current increases by flowing of the PF current through the switching layer in addition to the FN current. However, if the write operation onto the switching element according to the second comparative example repeats, the current voltage characteristics of the switching element deteriorate. Specifically, for example, by repeating the write operation, the on-current of the switching element deteriorates.

The current voltage characteristics of the switching element deteriorate, for example, by the diffusion of the metal 53*b* provided in the first area 51 to the intermediate electrode 20. In addition, the current voltage characteristics of the switching element deteriorate, for example, due to the diffusion of the metal 53*b* provided in the second area 52 to the upper electrode 30.

In the switching element according to the second comparative example, the on-current increases as the initial characteristics. However, if the write operation repeats, the current voltage characteristics deteriorate. Therefore, the reliability of the switching element decreases.

Unlike the switching layer according to the second comparative example, in the switching layer of the switching element according to the first embodiment, the first area 51 and the second area 52 do not include the metal 53*b*.

As illustrated in the right diagram of FIG. 5C, when the write voltage Vwrite is applied to the upper electrode 30, similarly to the second comparative example, the PF current flows through the switching layer in addition to the FN current. Therefore, the on-current of the switching element increases.

The first area 51 and the second area 52 do not include the metal 53*b*, and thus even when the write operation on the switching element according to the first embodiment repeats, diffusion of the metal 53*b* to the intermediate electrode 20 or the upper electrode 30 is prevented. Therefore, compared with the second comparative example, the reliability of the switching element is improved.

According to the first embodiment, a switching element having a low half-selected leakage current, a high on-current, and high reliability can be achieved.

In view of increasing the on-current, for example, the mole fraction of the additive metal provided in the third area 53 is preferably 10 mol % or more, more preferably 20 mol % or more, and even more preferably 30 mol % or more.

In view of improving the reliability, for example, the atomic concentration of the additive metal element provided in the first area 51 is preferably 5 at % or less and more preferably 1 at % or less. In view of improving the reliability, for example, the mole fraction of the additive metal provided in the first area 51 is preferably 5 mol % or less and more preferably 1 mol % or less. In view of improving the reliability, it is preferable that the first area 51 does not include an additive metal element and an additive metal.

In view of improving the reliability, for example, the atomic concentration of the additive metal element provided in the second area 52 is preferably 5 at % or less and more preferably 1 at % or less. In view of improving the reliability, for example, the mole fraction of the additive metal provided in the second area 52 is preferably 5 mol % or less and more preferably 1 mol % or less. In view of improving the reliability, it is preferable that the second area 52 does not include an additive metal element and an additive metal.

First Modification

A storage device according to a first modification of the first embodiment is different from the storage device according to the first embodiment in that the first area includes a first portion and a second portion provided between the first portion and the third area, and the atomic concentration of oxygen (O) in the second portion is higher than the atomic concentration of oxygen (O) in the first portion.

Figure 6:
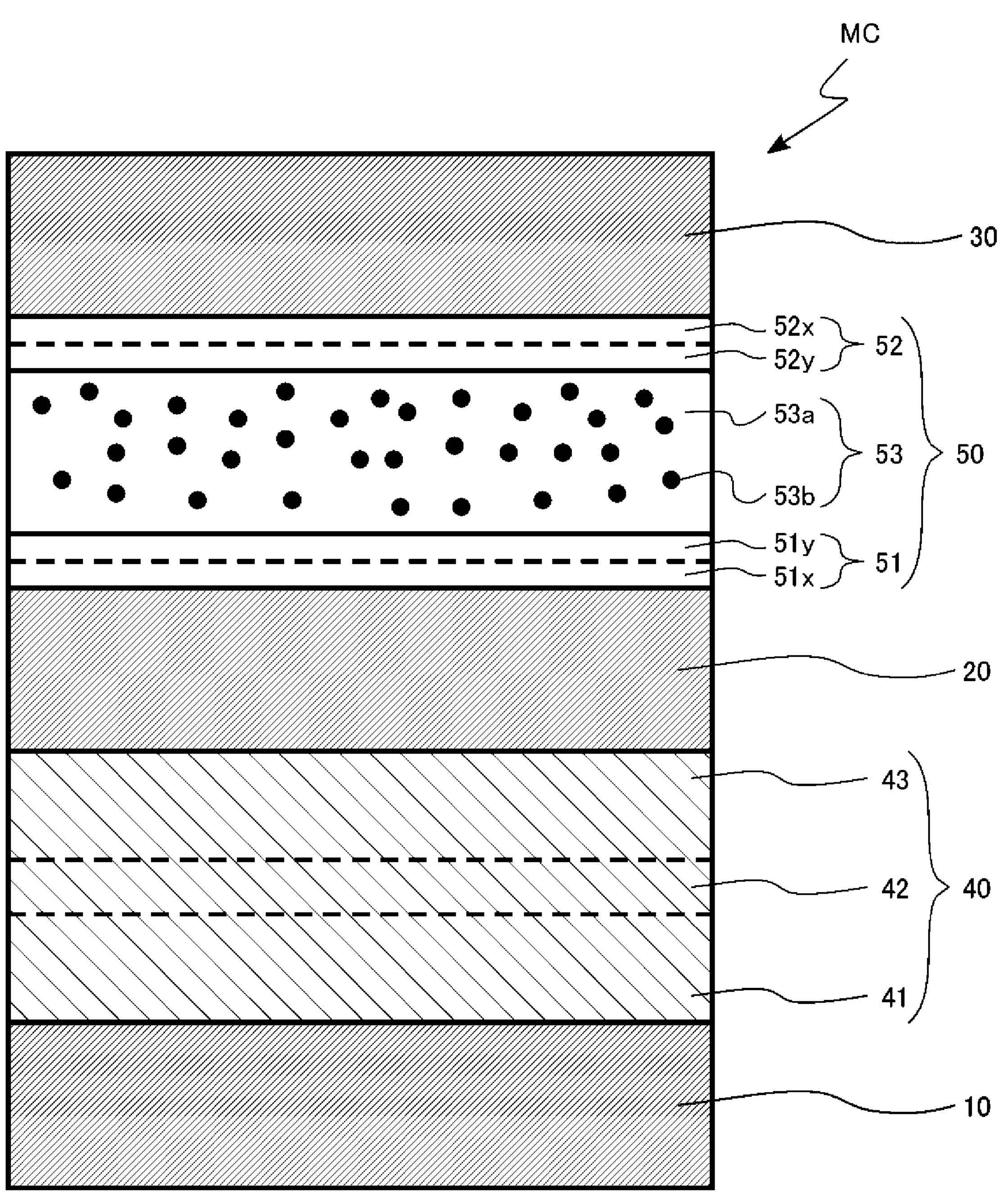
FIG. 6 is a schematic cross-sectional view illustrating a memory cell of a storage device according to a first modification of the first embodiment.

FIG. 6 is a schematic cross-sectional view illustrating a memory cell of the storage device according to the first modification of the first embodiment. FIG. 6 is a diagram corresponding to FIG. 2 of the first embodiment.

As illustrated in FIG. 6, the memory cell MC includes the lower electrode 10, the intermediate electrode 20, the upper electrode 30, the variable resistance layer 40, and the switching layer 50. The variable resistance layer 40 includes the fixed layer 41, the tunnel layer 42, and the free layer 43. The switching layer 50 includes the first area 51, the second area 52, and the third area 53. The third area 53 includes the matrix 53*a* and the metal 53*b*.

The first area 51 includes a first low oxygen portion 51*x* and a first high oxygen portion 51*y*. In addition, the second area 52 includes a second low oxygen portion 52*x* and a second-high oxygen portion 52*y*. The first low oxygen portion 51*x* is an example of the first portion. The first high oxygen portion 51*y* is an example of the second portion.

The first high oxygen portion 51*y* is provided between the third area 53 and the first low oxygen portion 51*x*. The atomic concentration of oxygen (O) in the first high oxygen portion 51*y* is higher than the atomic concentration of oxygen (O) of the first low oxygen portion 51*x*.

The second-high oxygen portion 52*y* is provided between the third area 53 and the second low oxygen portion 52*x*. The atomic concentration of oxygen (O) in the second-high oxygen portion 52*y* is higher than the atomic concentration of oxygen (O) in the second low oxygen portion 52*x*.

The first area 51 including the first low oxygen portion 51*x* and the first high oxygen portion 51*y* and the second area 52 including the second low oxygen portion 52*x* and the second-high oxygen portion 52*y* may be formed, for example, by a sputtering method. For example, by performing sputtering while the oxygen concentration in the atmosphere is changed, portions with different oxygen atom concentrations can be formed.

Since the first high oxygen portion 51*y* includes high concentration of oxygen, the electron affinity of the first high oxygen portion 51*y* is smaller than the electron affinity of the first low oxygen portion 51*x*. In other words, the barrier for electrons in the first high oxygen portion 51*y* is higher than the barrier for electrons in the first low oxygen portion 51*x*. The barrier for electrons in the first area 51 stepwise increases between the intermediate electrode 20 and the third area 53.

Since the second-high oxygen portion 52*y* includes high concentration of oxygen, the electron affinity of the second-high oxygen portion 52*y* is smaller than the electron affinity of the second low oxygen portion 52*x*. In other words, the barrier for electrons in the second-high oxygen portion 52*y* is higher than the barrier for electrons in the second low oxygen portion 52*x*. The barrier for electrons in the second area 52 stepwise increases between the upper electrode 30 and the third area 53.

The barrier for electrons in the switching layer 50 according to the first modification of the first embodiment stepwise increases toward the third area 53. Owing to the structure, the on-current easily increases while a low half-selected leakage current is maintained.

Second Modification

A storage device according to a second modification of the first embodiment is different from the storage device according to the first embodiment in that the switching layer includes a fourth area and a fifth area, a first area is provided between the fourth area and the third area, the fourth area includes at least one fourth element selected from the group consisting of tin (Sn), gallium (Ga), zinc (Zn), tantalum (Ta), titanium (Ti), and indium (In), and oxygen (O) or nitrogen (N), a second area is provided between the third area and the fifth area, the fifth area includes at least one fifth element selected from the group consisting of tin (Sn), gallium (Ga), zinc (Zn), tantalum (Ta), titanium (Ti), and indium (In), and oxygen (O) or nitrogen (N), the fourth element is different from the first element, and the fifth element is different from the second element.

Figure 7:
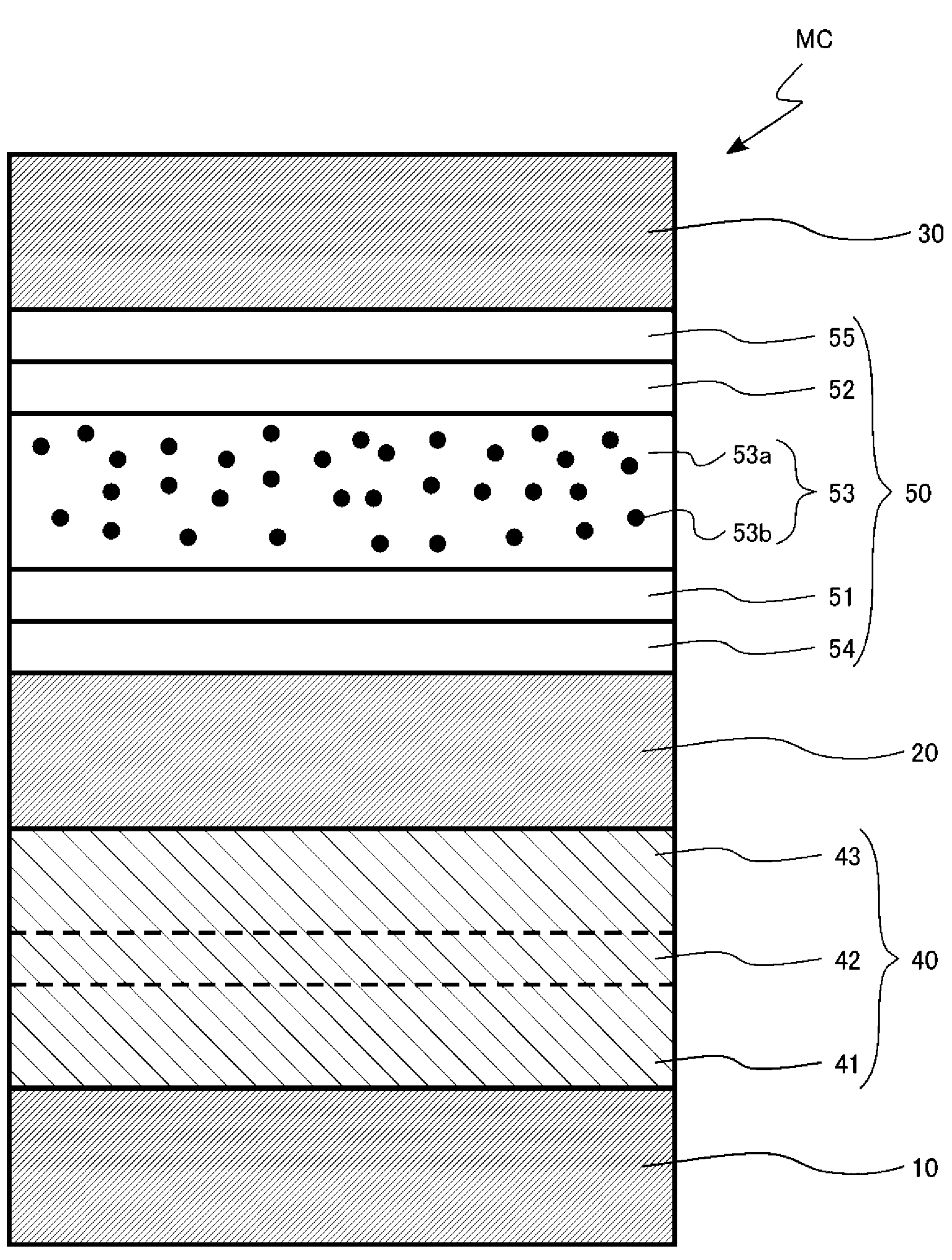
FIG. 7 is a schematic cross-sectional view illustrating a memory cell of a storage device according to a second modification of the first embodiment.

FIG. 7 is a schematic cross-sectional view illustrating the memory cell of the storage device according to the second modification of the first embodiment. FIG. 7 is a diagram corresponding to FIG. 2 of the first embodiment.

As illustrated in FIG. 7, the memory cell MC includes the lower electrode 10, the intermediate electrode 20, the upper electrode 30, the variable resistance layer 40, and the switching layer 50. The variable resistance layer 40 includes the fixed layer 41, the tunnel layer 42, and the free layer 43. The switching layer 50 includes the first area 51, the second area 52, the third area 53, a fourth area 54, and a fifth area 55. The third area 53 includes the matrix 53*a* and the metal 53*b*.

The fourth area 54 is provided between the intermediate electrode 20 and the first area 51. The first area 51 is provided between the fourth area 54 and the third area 53.

The fourth area 54 includes at least one fourth element selected from the group consisting of tin (Sn), gallium (Ga), zinc (Zn), tantalum (Ta), titanium (Ti), and indium (In), and oxygen (O) or nitrogen (N). The fourth element is different from the first element.

The electron affinity of the fourth area 54 is larger than the electron affinity of the first area 51. The fourth element is selected so that the electron affinity of the fourth area 54 is larger than the electron affinity of the first area 51.

The fifth area 55 is provided between the upper electrode 30 and the second area 52. The second area 52 is provided between the third area 53 and the fifth area 55.

The fifth area 55 includes at least one fifth element selected from the group consisting of tin (Sn), gallium (Ga), zinc (Zn), tantalum (Ta), titanium (Ti), and indium (In), and oxygen (O) or nitrogen (N). The fifth element is different from the second element.

The electron affinity of the fifth area 55 is larger than the electron affinity of the second area 52. The fifth element is selected so that the electron affinity of the fifth area 55 is larger than the electron affinity of the second area 52.

The electron affinity of the fourth area 54 is larger than the electron affinity of the first area 51. In other words, the barrier for electron in the fourth area 54 is lower than the barrier for electron in the first area 51. The barrier for electron in the switching layer 50 stepwise increases between the intermediate electrode 20 and the third area 53.

In addition, the electron affinity of the fifth area 55 is larger than the electron affinity of the second area 52. In other words, the barrier for electron in the fifth area 55 is lower than the barrier for electron in the second area 52. The barrier for electron in the switching layer 50 stepwise increases between the upper electrode 30 and the third area 53.

The barrier for electron in the switching layer 50 according to the second modification of the first embodiment stepwise increases toward the third area 53. Owing to the structure, the on-current easily increases while the low half-selected leakage current is maintained.

In the above, according to the first embodiment and the modifications, the switching element having a low half-selected leakage current, a high on-current, and high reliability can be achieved. Therefore, according to the first embodiment and the modifications, a storage device including a switching element having excellent characteristics can be achieved.

Second Embodiment

A storage device according to a second embodiment is different from the storage device according to the first embodiment in that the storage device according to the second embodiment is a resistance change-type memory (ReRAM). Hereinafter, the description of the content overlapping with the first embodiment is partially omitted.

Figure 8:
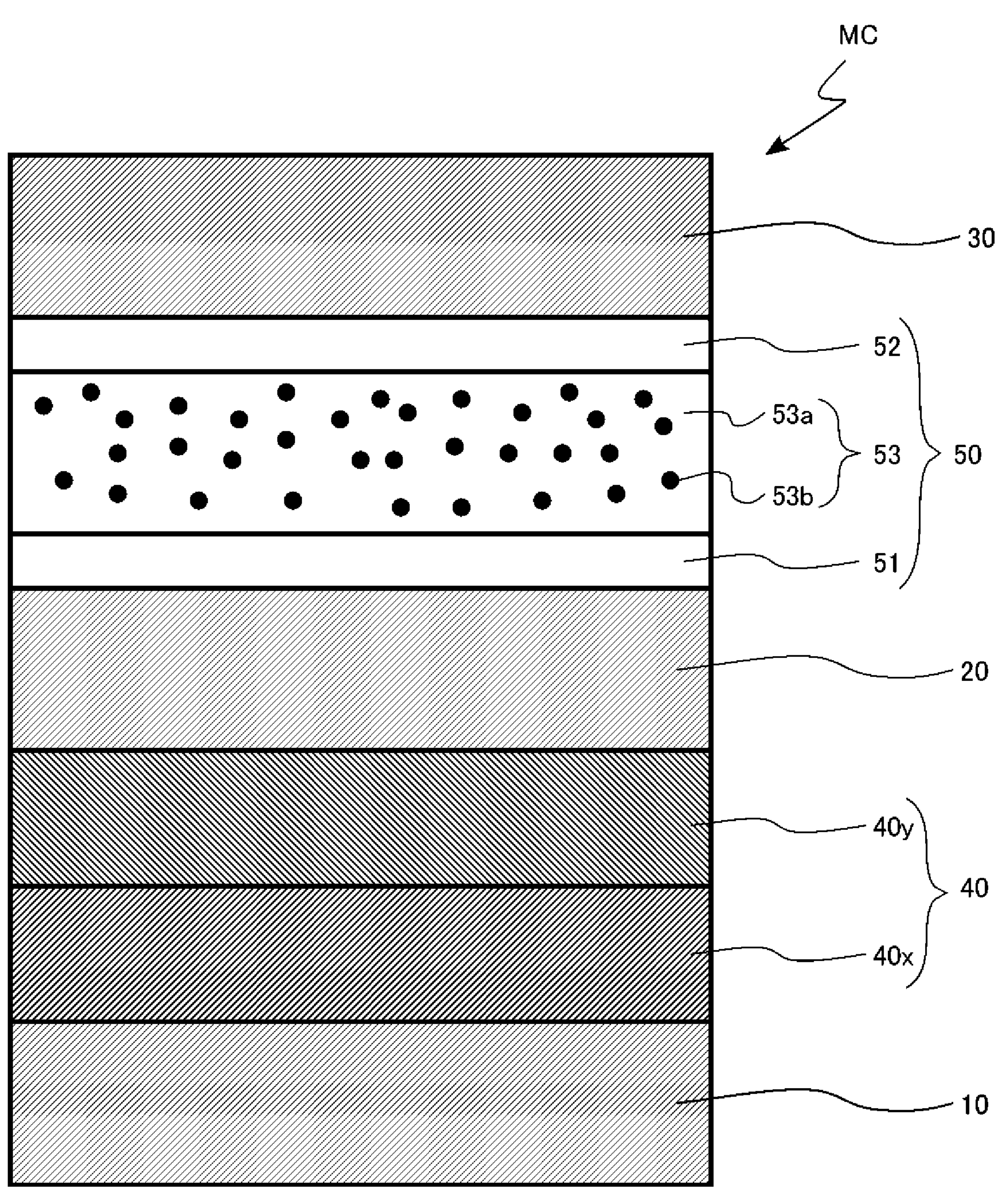
FIG. 8 is a schematic cross-sectional view illustrating a memory cell of a storage device according to a second embodiment.

FIG. 8 is a schematic cross-sectional view illustrating a memory cell of the storage device according to the second embodiment. FIG. 8 illustrates a cross section of one memory cell MC indicated by a dotted line circle in the memory cell array 100 of FIG. 1.

As illustrated in FIG. 8, the memory cell MC includes the lower electrode 10, the intermediate electrode 20, the upper electrode 30, the variable resistance layer 40, and the switching layer 50. The variable resistance layer 40 includes a high resistance layer 40*x* and a low resistance layer 40*y*. The switching layer 50 includes the first area 51, the second area 52, and the third area 53. The third area 53 includes the matrix 53*a* and the metal 53*b*.

The lower electrode 10 is an example of the first conductive layer. The intermediate electrode 20 is an example of the second conductive layer. The upper electrode 30 is an example of the third conductive layer.

The lower electrode 10, the variable resistance layer 40, and the intermediate electrode 20 constitute the resistance-variable element of the memory cell MC. The intermediate electrode 20, the switching layer 50, and the upper electrode 30 constitute the switching element of the memory cell MC.

The variable resistance layer 40 includes the high resistance layer 40*x* and the low resistance layer 40*y*.

The high resistance layer 40*x* is, for example, metal oxide. Examples of the high resistance layer 40*x* include aluminum oxide, hafnium oxide, zirconium oxide, tantalum oxide, or niobium oxide.

The low resistance layer 40*y* is, for example, metal oxide. Examples of the low resistance layer 40*y* include titanium oxide, niobium oxide, tantalum oxide, or tungsten oxide.

By applying the current to the variable resistance layer 40, the variable resistance layer 40 changes from the high resistance state to the low resistance state or from the low resistance state to the high resistance state. By applying the current to the variable resistance layer 40, oxygen ions move between the high resistance layer 40*x* and the low resistance layer 40*y*, and oxygen deficiency (oxygen vacancy amount) in the low resistance layer 40*y* changes. The electrical conductivity of the variable resistance layer 40 changes according to the oxygen deficiency in the low resistance layer 40*y*. The low resistance layer 40*y* is so-called vacancy modulated conductive oxide.

For example, the high resistance state is defined as data of "1", and the low resistance state is defined as data of "0". The memory cell can store 1-bit data of "0" and "1".

The configuration of the switching layer 50 is the same as the storage device according to the first embodiment.

In the above, with the storage device according to the second embodiment, similarly to the first embodiment, a switching element having a low half-selected leakage current, a high on-current, and high reliability can be achieved. Therefore, according to the second embodiment, the storage device including the switching element having excellent characteristics can be achieved.

The magnetoresistive memory is described as the two-terminal storage device in the first embodiment, and the resistance change-type memory is described as the storage device in the second embodiment. However, the present disclosure is applicable to another two-terminal storage device. For example, the present disclosure is applicable to a phase change memory (PCM) or a ferroelectric random-access memory (FeRAM).

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A storage device comprising:

a first conductive layer;

a second conductive layer;

a third conductive layer;

a variable resistance layer disposed between the first conductive layer and the second conductive layer; and a switching layer disposed between the second conductive layer and the third conductive layer, wherein the second conductive layer is disposed between the first conductive layer and the third conductive layer, the switching layer includes a first area, a second area, and a third area, the third area disposed between the first area and the second area, the first area includes (i) at least one first element selected from the group consisting of tin (Sn), gallium (Ga), zinc (Zn), tantalum (Ta), titanium (Ti), and indium (In), and (ii) oxygen (O) or nitrogen (N), the second area includes (i) at least one second element selected from the group consisting of tin (Sn), gallium (Ga), zinc (Zn), tantalum (Ta), titanium (Ti), and indium (In), and (ii) oxygen (O) or nitrogen (N), and the third area includes (i) at least one third element selected from the group consisting of zirconium (Zr), yttrium (Y), cerium (Ce), hafnium (Hf), aluminum (Al), magnesium (Mg), and niobium (Nb), (ii) oxygen (O) or nitrogen (N), and (iii) at least one metal element selected from the group consisting of tellurium (Te), antimony (Sb), bismuth (Bi), titanium (Ti), and zinc (Zn), wherein the first area includes at least one first substance selected from the group consisting of oxides of the first element, nitrides of the first element, and oxynitrides of the first element, the first substance being an insulator, the second area includes at least one second substance selected from the group consisting of oxides of the second element, nitrides of the second element, and oxynitrides of the second element, the second substance being another insulator, and the third area includes at least one third substance selected from the group consisting of oxides of the third element, nitrides of the third element, and oxynitrides of the third element, and metal including the metal element.

2. The storage device according to claim 1, wherein the first element and the second element are the same element (s).

3. The storage device according to claim 1, wherein the metal element is different from each of the first element and the second element.

4. The storage device according to claim 1, wherein a thickness of the third area in a first direction from the first conductive layer to the second conductive layer is greater than a thickness of the first area in the first direction and greater than a thickness of the second area in the first direction.

5. The storage device according to claim 1, wherein an electron affinity of the third area is smaller than an electron affinity of each of the first area and the second area.

6. The storage device according to claim 1, wherein a mole fraction of the third substance disposed in the third area is 50 mol % or more.

7. The storage device according to claim 1, wherein a mole fraction of the metal disposed in the third area is 10 mol % or more.

8. The storage device according to claim 1, wherein an electron affinity of the third substance is smaller than an electron affinity of each of the first substance and the second substance.

9. The storage device according to claim 1, wherein the first area includes a first portion and a second portion disposed between the first portion and the third area, and an oxygen atomic concentration of the second portion is higher than an oxygen atomic concentration of the first portion.

10. The storage device according to claim 1, wherein the switching layer further includes a fourth area and a fifth area, the first area is disposed between the fourth area and the third area, the fourth area includes (i) at least one fourth element selected from the group consisting of tin (Sn), gallium (Ga), zinc (Zn), tantalum (Ta), titanium (Ti), and indium (In), and (ii) oxygen (O) or nitrogen (N), the second area is disposed between the third area and the fifth area, and the fifth area includes (i) at least one fifth element selected from the group consisting of tin (Sn), gallium (Ga), zinc (Zn), tantalum (Ta), titanium (Ti), and indium (In), and (ii) oxygen (O) or nitrogen (N), and the fourth element is different from the first element, and the fifth element is different from the second element.

11. The storage device according to claim 1, wherein the variable resistance layer includes a magnetic tunnel junction.

12. A storage device comprising:

a plurality of first wirings;

a plurality of second wirings, at least one of the plurality of second wirings intersecting at least one of the plurality of first wirings; and memory cells positioned in areas where the at least one of the plurality of first wirings and the at least one of the plurality of second wirings intersect each other, wherein the memory cell includes:

a first conductive layer;

a second conductive layer;

a third conductive layer;

a variable resistance layer disposed between the first conductive layer and the second conductive layer; and a switching layer disposed between the second conductive layer and the third conductive layer, the second conductive layer is disposed between the first conductive layer and the third conductive layer, the switching layer includes a first area, a second area, and a third area disposed between the first area and the second area, the first area includes (i) at least one first element selected from the group consisting of tin (Sn), gallium (Ga), zinc (Zn), tantalum (Ta), titanium (Ti), and indium (In), and (ii) oxygen (O) or nitrogen (N), the second area includes (i) at least one second element selected from the group consisting of tin (Sn), gallium (Ga), zinc (Zn), tantalum (Ta), titanium (Ti), and indium (In), and (ii) oxygen (O) or nitrogen (N), and the third area includes (i) at least one third element selected from the group consisting of zirconium (Zr), yttrium (Y), cerium (Ce), hafnium (Hf), aluminum (Al), magnesium (Mg), and niobium (Nb), (ii) oxygen (O) or nitrogen (N), and (iii) at least one metal element selected from the group consisting of tellurium (Te), antimony (Sb), bismuth (Bi), titanium (Ti), and zinc (Zn), wherein the first area includes (i) at least one first substance selected from the group consisting of oxides of the first element, nitrides of the first element, and (ii) oxynitrides of the first element, the second area includes (i) at least one second substance selected from the group consisting of oxides of the second element, nitrides of the second element, and (ii) oxynitrides of the second element, and the third area includes (i) at least one third substance selected from the group consisting of oxides of the third element, nitrides of the third element, and (ii) oxynitrides of the third element, and (iii) metal including the metal element.

13. The storage device according to claim 12, wherein the first element and the second element are the same element (s).

14. The storage device according to claim 12, wherein the metal element is different from each of the first element and the second element.

15. The storage device according to claim 12, wherein a thickness of the third area in a first direction from the first conductive layer to the second conductive layer is greater than a thickness of the first area in the first direction, and greater than a thickness of the second area in the first direction.

16. The storage device according to claim 12, wherein an electron affinity of the third area is smaller than an electron affinity of each of the first area and the second area.

17. The storage device according to claim 12, wherein a mole fraction of the third substance disposed in the third area is 50 mol % or more.

18. The storage device according to claim 12, wherein a mole fraction of the metal disposed in the third area is 10 mol % or more.

19. The storage device according to claim 12, wherein each of the first substance and the second substance is an insulator.

* * * * *